(12) United States Patent
Ochiai et al.

(10) Patent No.: US 7,119,424 B2
(45) Date of Patent: Oct. 10, 2006

(54) SEMICONDUCTOR DEVICE AND METHOD FOR MANUFACTURING THE SAME

(75) Inventors: Isao Ochiai, Ota (JP); Toshiyuki Take, Gunma (JP); Tetsuya Fukushima, Fukaya (JP)

(73) Assignee: Sanyo Electric Co., Ltd., Saitama (JP)

( * ) Notice: Subject to any disclaimer, the term of this patent is extended or adjusted under 35 U.S.C. 154(b) by 0 days.

(21) Appl. No.: 10/872,454

(22) Filed: Jun. 22, 2004

(65) Prior Publication Data

US 2004/0222513 A1 Nov. 11, 2004

Related U.S. Application Data

(62) Division of application No. 10/352,859, filed on Jan. 29, 2003, now Pat. No. 6,893,903.

(30) Foreign Application Priority Data

Jan. 29, 2002 (JP) .............................. 2002-020297

(51) Int. Cl.
*H01L 23/495* (2006.01)
*H01L 23/04* (2006.01)

(52) U.S. Cl. ............... 257/676; 257/666; 257/667; 257/672; 257/674; 257/730; 257/E23.141

(58) Field of Classification Search ............... 257/666, 257/667, 672, 674, 676, 730, E23.141
See application file for complete search history.

(56) References Cited

U.S. PATENT DOCUMENTS

| | | | |
|---|---|---|---|
| 5,293,065 A | 3/1994 | Chan | |
| 5,440,169 A * | 8/1995 | Tomita et al. | 257/667 |
| 5,559,366 A * | 9/1996 | Fogal et al. | 257/666 |
| 6,072,239 A * | 6/2000 | Yoneda et al. | 257/730 |
| 6,242,797 B1 * | 6/2001 | Ichikawa et al. | 257/666 |
| 6,309,575 B1 | 10/2001 | Boutin et al. | |
| 6,388,338 B1 * | 5/2002 | Ramano' et al. | 257/787 |
| 6,424,023 B1 | 7/2002 | Kim et al. | |
| 6,900,524 B1 * | 5/2005 | Minamio et al. | 257/666 |
| 6,983,537 B1 * | 1/2006 | Park | 29/840 |
| 2003/0087478 A1 | 5/2003 | Kasuga et al. | |

FOREIGN PATENT DOCUMENTS

JP     08-181160     7/1996

* cited by examiner

*Primary Examiner*—Jerome Jackson
*Assistant Examiner*—Joseph Nguyen
(74) *Attorney, Agent, or Firm*—Watchstone P&D llc; Stephen B. Parker

(57) ABSTRACT

A semiconductor device (21) can include, e.g., a recessed portion (25) on the reverse surface (224) of an insulating resin (22) which is the mounting surface of the semiconductor device (21). Additionally, on the outer peripheral surface of the recessed portion (25), the exposed region of leads (26) and the reverse surface (224) of the insulating resin (22) form generally the same plane. This allows, e.g., a QFN semiconductor device (21) according to preferred embodiments herein to place dust particles in the recessed portion (25) even in the presence of dust particles such as crushed burr particles of the leads (26) or plastic burrs, thereby avoiding mounting deficiencies when mounting the semiconductor device.

6 Claims, 14 Drawing Sheets

Prior Art

Prior Art

Prior Art

SEMICONDUCTOR DEVICE AND METHOD FOR MANUFACTURING THE SAME

This application is a divisional of application Ser. No. 10/352,859, filed Jan. 29, 2003, now U.S. Pat. No. 6,893,903, which claims priority to Japanese Patent Application Serial Number JP2002-020297, filed on Jan. 29, 2002, the entire disclosures of which are both incorporated herein by reference.

BACKGROUND OF THE INVENTION

1. Field of the Invention

The preferred embodiments of present invention relate to, among other things, a reverse mounted leadless semiconductor device and, more particularly, to a semiconductor device and a method for manufacturing the same that can be employed to reduce deficiencies caused when mounting the semiconductor device.

2. Description of the Related Art

The following description sets forth the inventors' knowledge of related art and problems therein and should not be construed as an admission of knowledge in the prior art. As semiconductor device capacities have been increased year-by-year, the number of required lead terminals, which serve as various signal lines, has tended to increase. This tendency has resulted in greater use of semiconductor devices such as QFP (Quad Flat Package) semiconductor devices having lead terminals extending from their four sides and QFN (Quad Flat Non-leaded Package) semiconductor devices. For example, one practical example of a method for manufacturing a QFP semiconductor device is disclosed in Japanese Unexamined Patent Publication No. Hei-8-181160.

Illustrative existing methods for manufacturing a semiconductor device are now described below with reference to FIGS. 12–15. In that regard, FIG. 12 is a plan view illustrating a lead frame. FIG. 13 is a perspective view illustrating a mold. And, FIG. 14 is a plan view illustrating a lead frame after having been encapsulated with plastic.

First, as shown in FIG. 12, a semiconductor element is mounted, via silver paste serving as a bonding agent, on a stage 2 of a lead frame 1. Although not illustrated, the semiconductor element has a plurality of electrode portions on its surface and is mounted on the stage to be fixedly attached thereto. Thereafter, the electrode portions are electrically connected to lead terminals 3 using wire bonding.

As shown in FIG. 13, after the semiconductor element has been mounted as described above, the lead frame 1 is placed in between an upper mold 7 and a lower mold 8. Thereafter, closing the molds causes a cavity to be defined which serves as an injection volume.

Then, a melted plastic is injected at a predetermined pressure therein through a pot 10' of the upper mold 7. The plastic flows into the cavities of the upper mold 7 and the lower mold 8, filling in a cavity 9 via a runner 11, thereby encapsulating the semiconductor element. Although air exists inside the cavity 9 before the plastic is injected, the plastic pushes the air out through an air vent at the stage of the plastic penetrates the cavity. Then, the air flows outside through a hole 5 formed in the lead frame 1. The air vent is formed in the molds 7 and 8 and has a sufficient extent of clearance not to allow the plastic to pass therethrough.

After the plastic filled has cooled down and solidified, the molds are opened to take out the lead frame 1. The lead frame at this point in time is shown in FIG. 14. In this figure, to clarify the flow passage of the plastic, portions where the pot and runner were present at the time of plastic encapsulation are shown with dashed lines. As can be seen clearly from FIG. 14, the plastic flows into the molds from a pot portion 10 that is located at the center of four encapsulation regions through a gate portion 4. This allows the semiconductor element to be mounted on the stage and part of the lead terminals 3 located around the periphery of the semiconductor element to be covered with the plastic, thereby forming a package 12. Thereafter, joint portions of the lead terminals 3 are cut off, and the separated lead terminals 3 are bent as necessary to thereby complete a QFP semiconductor device.

Next, FIGS. 15(A) and 15(B) illustrate a QFP semiconductor device that has been formed by the same method as that for manufacturing the aforementioned QFN semiconductor device.

FIG. 15(A) is a cross-sectional view illustrating a semiconductor device including a lead 15 formed portion. As illustrated, this background semiconductor device is configured such that a semiconductor element 16 is fixedly attached to an island 14 formed of a Cu frame via an electrically conductive paste 17 such as silver (hereinafter referred to as Ag) paste. An electrode pad (not shown) of the semiconductor element 16 is electrically connected to the lead 15 via a thin metal wire 18. In addition, an insulating resin 19, which integrally covers the semiconductor element 16 and other components, is formed on the island 14 and the lead 15 made of a Cu frame. Then, the reverse surface of the island 14 and the lead 15 is plated for prevention of oxidation and solder wettability. With this structure, for example, the lead 15 is mounted to a mounting substrate (not shown) via solder. At this time, the reverse surface of the semiconductor device is formed to be generally flush therewith, ensuring that the semiconductor device is mounted on the mounting substrate with stability.

Now, FIG. 15(B) is a cross-sectional view illustrating a semiconductor device including a lifting lead 13 formed portion. As illustrated, on the upper surface of the lifting lead 13 exposed on the side surface of the insulating resin 19, plastic burrs 19A are produced continuously on the side surface of the insulating resin 19. These burrs are the plastic that has flowed into the air vent portion provided in the molds and hardened, for example, with a thickness of approximately 30 µm.

As described above, the mounting surface of the semiconductor device is formed to have generally the same plane as shown in FIG. 15(A) in the background QFN semiconductor device. For this reason, when the semiconductor device is mounted onto the mounting substrate, mounting deficiencies are caused by dust particles such as plastic particles entering in between the substrate and the semiconductor device.

Furthermore, as described above, in the method for manufacturing a background semiconductor device, the air present in the cavity 9 is driven towards the end portion of the cavity 9, from which the air passes outwardly through the air vent provided in the molds, as shown in FIG. 13. However, when the air is pushed out via the air vent, the plastic turns into burrs between the lead frame 1 and the upper mold 7 or between the lead frame 1 and the lower mold 8. To cut the package 12 out of the lead frame 1, the peripheral portion of the package 12 is cut while being fixed. However, as shown in FIG. 15(B), when plastic burrs 19A have occurred on this fixed region, especially on the surface of the lifting lead 13, it can be impossible to reliably secure the leads 3. As a result, on the cutting surface of the plastic formed between the leads 3, microcracks can be produced.

In subsequent steps, these cracks will turn to be plastic particles, etc., which would induce mounting deficiencies in the mounting step.

Furthermore, in the method for manufacturing a background semiconductor device, the air present in the cavity 9 is driven towards the end portion of the cavity 9, from which the air passes the cavity 9 outwardly through the air vent provided in the mold 7. However, when the air is pushed out via the air vent, the plastic turns into burrs between the lead frame 1 and the upper mold 7 or between the lead frame 1 and the lower mold 8. Because the plastic burrs are as thin as approximately 30 µm, the plastic burrs are integrated with the package and may remain in the mold when the package is removed from the mold 6. The plastic burrs remaining in the mold may block the passage of air present in the cavity 9 at the time of the subsequent plastic molding. As a result, because the air does not flow outside and thus remains compressed in the cavity 9, such a problem can arise wherein voids and/or unfilled volumes occur in the package.

There is a need in the art for improved systems and methods that overcome the above and/or other problems.

SUMMARY OF THE INVENTION

The various preferred embodiments of the present invention significantly improve upon existing systems and methods.

The preferred embodiments of the present invention were developed in view of the aforementioned and/or other problems. A semiconductor device according to some preferred embodiments includes: at least one island; a semiconductor element fixedly attached to a surface of said island; a plurality of leads extending from the vicinity of said island outwardly and lifting leads extending outwardly from corner portions of said island; and an insulating resin for covering said island, said semiconductor element, said leads, and said lifting leads integrally, wherein one end of said leads is exposed generally on the same plane as a reverse surface of said insulating resin, and the reverse surface of said insulating resin has a recessed portion at least at part of a region surrounded by an exposed surface of said leads.

Furthermore, the semiconductor device preferably includes that plastic hardened between said leads exposed on said insulating resin and plastic hardened between said leads exposed on said insulating resin and said lifting leads have generally the same thickness as said lead frame.

Furthermore, the semiconductor device preferably includes that one end of said leads and one end of said lifting leads have a stamped surface on a side of the mounting surface of said insulating resin.

According to other preferred embodiments, a method for manufacturing a semiconductor device includes: preparing a lead frame having at least one mounting portion including at least an island, leads, and lifting leads, and fixedly attaching a semiconductor element to the island of said lead frame; forming an insulating resin for each mounting portion after said semiconductor element is electrically connected to said leads via a thin metal wire; and separating said insulating resin individually for each mounting portion by cutting said lead frame, wherein in said forming said insulating resin, said lead frame located at an end portion of said insulating resin is sandwiched with a plastic encapsulation mold, plastic is filled in the plastic encapsulation mold through an air vent provided on said lead frame, air and plastic are exhausted from the plastic encapsulation mold through an air vent provided on said lead frame, said air vent being located at said sandwiched lead frame.

Furthermore, the semiconductor device preferably includes that on the reverse surface of the insulating resin which is a mounting surface of the semiconductor device, a recessed portion is formed on a region excluding the mounting region on the outer peripheral surface on which leads are exposed. This makes it possible to, for example, significantly improve the probability of mounting deficiencies by placing dust particles in the recessed portion formed region even in the presence of dust particles such as plastic burrs on the mounting substrate and mounting surface of the semiconductor device when mounting the semiconductor device.

Furthermore, the semiconductor device preferably includes that the thickness of the lifting leads exposed on the side surface of the insulating resin and the thickness of the plastic near the lifting leads are made generally the same. This allows, for example, the upper surfaces of the lifting leads and the plastic near the leads to be generally flush with each other, and used as a lead securing region upon cutting the leads. As a result, it is possible to stabilize the cutting surface of the leads and the plastic near the leads.

Furthermore, the semiconductor device preferably includes that one end of the lifting leads is exposed on the mounting surface of the semiconductor device. This allows, for example, the mounting area of the semiconductor device to be increased, thereby providing an increased mounting strength.

Furthermore, the semiconductor device preferably includes that an island is exposed on the surface of the insulating resin opposite to the mounting surface of the semiconductor device. This allows, for example, the heat generated by the semiconductor element to be dissipated directly outwardly from the island, thereby improving the heat dissipation.

Furthermore, the manufacturing method of the semiconductor device preferably includes that in forming the insulating resin, the plastic is injected into the cavity and the air and plastic are exhausted from the cavity only through the first air vent substantially formed on the lead frame. This makes it possible, for example, to form the same flat surface having no projected or recessed portions due to plastic burrs on the outer peripheral surface formed successively to the side surface of the insulating resin.

Furthermore, the method for manufacturing the semiconductor device preferably includes that, at the time of cutting the individual semiconductor devices out of the lead frame, the insulating resin and the vicinity of the boundary between the insulating resin and the leads exposed on the side surface of the insulating resin are reliably secured and cut. This allows, for example, for stabilizing the cutting surface of the leads and the plastic near the leads. As a result, it is possible to, for example, prevent microcracks in the plastic located at the cutting surface, prevent plastic dust particles resulting from the growth of cracks, and significantly reduce the possibility of mounting deficiencies of the semiconductor device.

Furthermore, the method for manufacturing the semiconductor device preferably includes that the leads, the lifting leads, and the plastic near the leads are cut from the mounting surface of the semiconductor device. This preferably causes a stamped surface of the leads, the lifting leads, and the plastic to be formed on the side of the mounting surface. On the other hand, the burrs of the leads, the lifting leads, and the plastic are preferably formed on the surface opposite to the mounting surface. As a result, substantially no or no projected or recessed portions are preferably formed on the mounting surface of the semiconductor device, and the mounting accuracy and the stability of the semiconductor device can be improved.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The accompanying figures are provided by way of example, without limiting the broad scope of the invention or various other embodiments, wherein.

DETAILED DESCRIPTION OF THE PREFERRED EMBODIMENTS

Now, semiconductor devices and methods for manufacturing the same according to some preferred embodiments of the invention will be described below with reference to FIG. 1 through FIG. 11.

First, referring to FIG. 1 through FIG. 3, a QFN semiconductor device according to some preferred embodiments is described below.

Figure 1A:
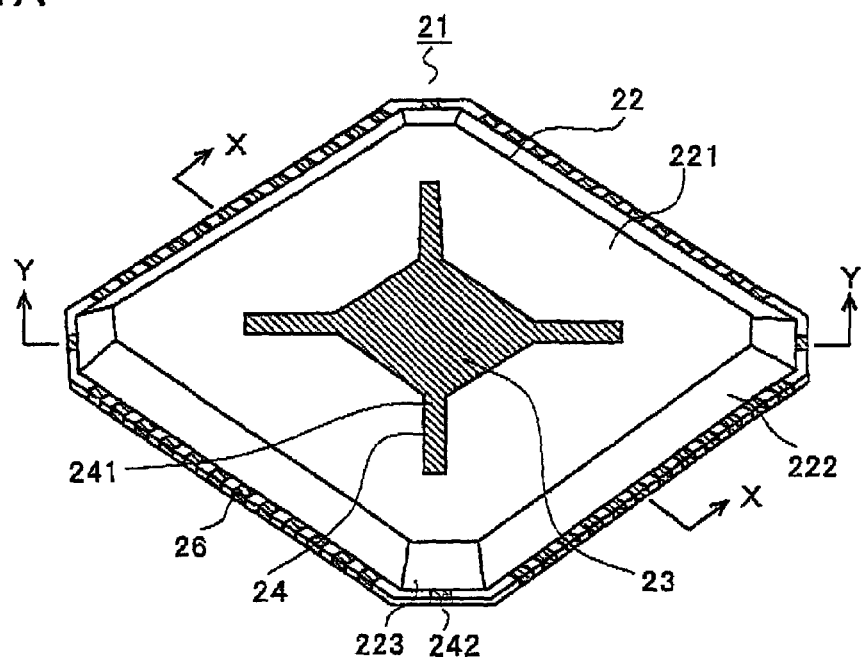
FIG. 1(A) is an explanatory perspective view and FIG. 1(B) is an explanatory plan view, illustrating a semiconductor device according to the present invention.
Figure 1B:
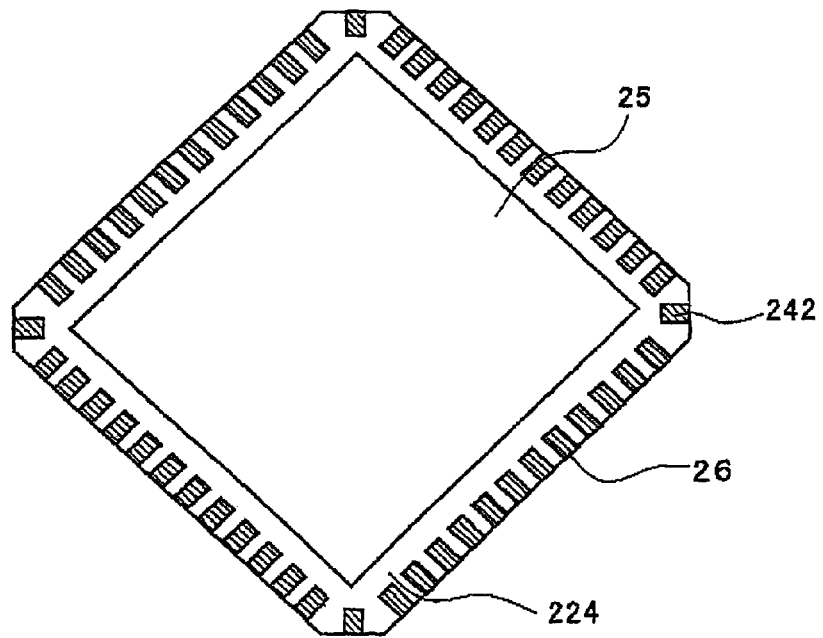

FIG. 1(A) is a perspective view illustrating the semiconductor device according to some embodiments of the present invention. FIG. 1(B) is a plan view illustrating the reverse surface of the semiconductor device shown in FIG. 1(A). As shown in FIG. 1(A), on the front surface of a semiconductor device 21 according to these embodiments, part of an island 23 and one end 241 of lifting the leads 24 are preferably exposed on a front surface 221 of an insulating resin 22 made of an insulating plastic forming the package. Additionally, on side surfaces 222 of the insulating resin 22, one end of the leads 26 is preferably slightly exposed. Although detailed in a manufacturing method described later, the exposed region is preferably capable of securing the leads 26 with a lead cutting jig at the time of cutting the leads 26 from a lead frame 41 (see, e.g., FIG. 4). More specifically, the exposed region is preferably exposed from the insulating resin 22 approximately 50 µm through 200 µm. On four corner side surfaces 223 of the insulating resin 22 at which the four side surfaces 222 allowing the leads 26 to be exposed thereon intersect each other, the other end 242 of the lifting leads 24 is preferably slightly exposed. In this case, as for the leads 26, the exposed region is preferably capable of securing the lifting leads 24 at the time of cutting the lifting leads 24 from the lead frame 41. More specifically, the exposed region is also preferably exposed approximately 50 µm through 200 µm from the insulating resin 22.

In these embodiments, the island 23 exposed on the front surface 221 of the insulating resin 22 can, e.g., improve the heat dissipation generated by the semiconductor element. The front surface 221 of the insulating resin 22, the reverse surface of the island 23, and the reverse surface of the one end 241 of the lifting leads 24 are preferably located generally on the same plane, thereby realizing the semiconductor device 21 itself reduced in thickness. The island 23 is preferably not limited to a particular position but may be located at any position so long as, e.g., a recessed portion 25, described later, can be formed there.

As shown in FIG. 1(B), the reverse surface of the semiconductor device 21 according to these embodiments preferably functions as a mounting region for the semiconductor device 21. On the outer peripheral portion on a reverse surface 224 of the insulating resin 22, the other end 242 of the lifting leads 24 and the mounting surface of the one end of the leads 26 (e.g., an abutting surface of the mounting substrate) are preferably exposed so as to be generally flush with the reverse surface 224 of the insulating resin 22. The other end 242 of the lifting leads 24 and the mounting surface of the one end of the leads 26 can be mounted to a mounting substrate (not shown) via a securing material such as, e.g., solder. Here, the semiconductor device preferably includes that even the other end 242 of the lifting leads 24 is exposed on the reverse surface 224 of the insulating resin 22. With this structure, the mounting area can be increased and the mounting strength can also be improved. Here, on the reverse surface 224 of the insulating resin 22, the exposed region of the other end 242 of the lifting leads 24 can be placed around the recessed portion 25, thereby causing it to be located outside the exposed region of the leads 26. This structure thus employed can mitigate the concentration of the mounting region at the corners of the reverse surface 224 of the insulating resin 22. This can also prevent the lifting leads 24 and the leads 26, adjacent to each other, from having bridged solder, and thereby allowing the individual leads 26 to be electrically connected reliably to the desired electrically conductive pattern (not shown) on the mounting substrate. Additionally, on the exposed region of the lifting leads 24, when the mounting region has a mitigated concentration, it is possible to further improve the mounting strength by increasing the exposed region of the lifting leads 24. This is because, e.g., the increased exposed region can be fixedly attached to the electrically conductive pattern of the mounting substrate via solder.

Furthermore, the semiconductor device preferably includes that the recessed portion 25 is provided on the reverse surface 224 of the insulating resin 22. This structure is described below in more detail with reference to FIGS. 2(A) and 2(B).

Figure 2A:
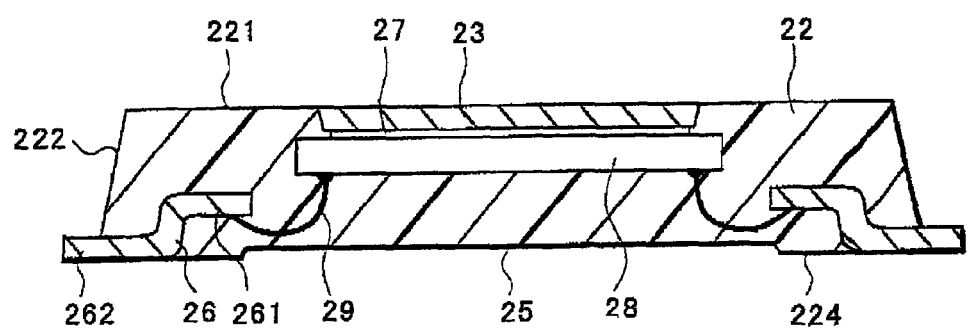
FIG. 2(A) is an explanatory cross-sectional view and FIG. 2(B) is an explanatory cross-sectional view, illustrating a semiconductor device according to the present invention.
Figure 2B:
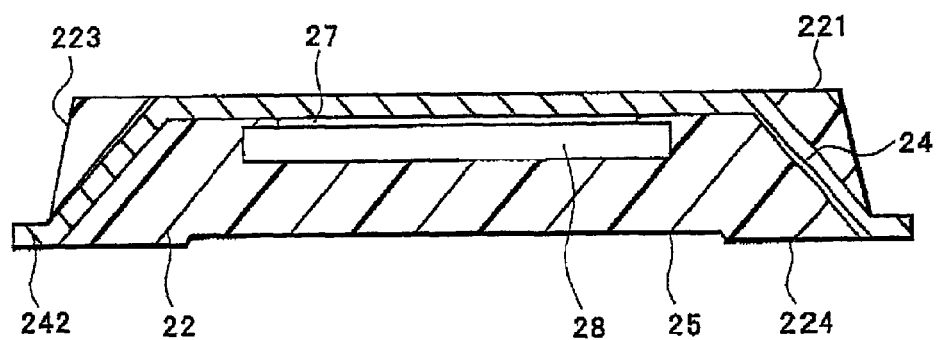

FIG. 2(A) is a cross-sectional view taken along line X—X of FIG. 1(A) showing a semiconductor device according some embodiments of the present invention. FIG. 2(B) is a cross-sectional view taken along line Y—Y of FIG. 1(A) showing a semiconductor device according to some embodiments of the present invention. First, as shown in FIG. 2(A), the cross-sectional structure of the semiconductor device 21 according to some embodiments is described below. As described above, the island 23 is preferably exposed on the front surface 221 of the insulating resin 22 to be generally flush therewith. For example, a semiconductor element 28 is preferably fixedly attached to a surface opposite to the exposed surface of the island 23 via an electrically conductive paste 27 such as, for example, Ag paste. The electrode pad portion (not shown) of the semiconductor element 28 can be electrically connected to the leads 26 via a thin metal wire 29. One end 262 of the leads 26 is preferably exposed to be generally flush with the reverse surface 224 of the insulating resin 22 while the other end 261 of the leads 26 connecting to the thin metal wire 29 is preferably located inside the insulating resin 22.

As described above, the semiconductor device preferably includes that the recessed portion 25 is provided on the reverse surface 224 of the insulating resin 22. More specifically, the one end 262 of the leads 26 is preferably exposed on the reverse surface 224 of the insulating resin 22, and the insulating resin 22 itself preferably has a flat surface in consideration of the stability when mounting the semiconductor device 21. Inside that region, for example, the recessed portion 25 is preferably formed to occupy approximately two thirds of the reverse surface 224 of the insulating resin 22. In this embodiment, the recessed portion 25 is preferably formed to be approximately 10 μm through 200 μm in depth, for example. However, the depth of the recessed portion 25 can be freely modified in accordance with, e.g., the thickness of the semiconductor device 21 itself, the position of the island 23 inside the insulating resin 22, and other use purposes. With this structure, when the semiconductor device 21 is mounted on the mounting substrate, etc., it is possible to significantly reduce mounting deficiencies by forming the recessed portion 25 formed region in the semiconductor device 21 even in the presence of dust particles such as plastic burrs between the semiconductor device 21 and the mounting substrate. The recessed portion 25 formed region can be changed as, e.g., the depth thereof or a plurality of recessed portion 25 formed regions may be formed on the reverse surface 224 of the insulating resin 22, according to use purposes.

Then, as shown in FIG. 2(B), the semiconductor device 21 according to these embodiments allows the island 23 to be exposed on the front surface 221 of the insulating resin 22. This can ensure a thickness of plastic from the surface of the semiconductor element 28 to the reverse surface 224 of the insulating resin 22, thus ensuring the recessed portion 25 formed region on the mounting surface of the semiconductor device 21. In these embodiments, the island 23 can be exposed on the front surface 221 of the insulating resin 22, thereby improving the heat dissipation generated by the semiconductor element 28. Furthermore, in these embodiments, to increase the mounting area of the QFN semiconductor device 21, the other end 242 of the lifting leads 24 is preferably exposed on the reverse surface 224 of the insulating resin 22. At this time, as described above, the other end 242 of the lifting leads 24 is preferably also exposed on the reverse surface 224 of the insulating resin 22 to improve the mounting strength of the semiconductor device 21. The corner portions of the insulating resin 22 on which the lifting leads 24 are exposed may be short-circuited due to bridged solder resulting from concentrations in the mounting area. For this reason, the exposed region of the lifting leads 24 can be determined in consideration of the concentrations in the mounting region with the leads 26 at the corner portions.

Although not illustrated, the securing region of the island 23 can be plated with silver or gold in consideration of the adherence to the electrically conductive paste 27. On the other hand, the leads 26 can be plated with silver or nickel in consideration of the adherence to the thin metal wire 29.

Figure 3A:
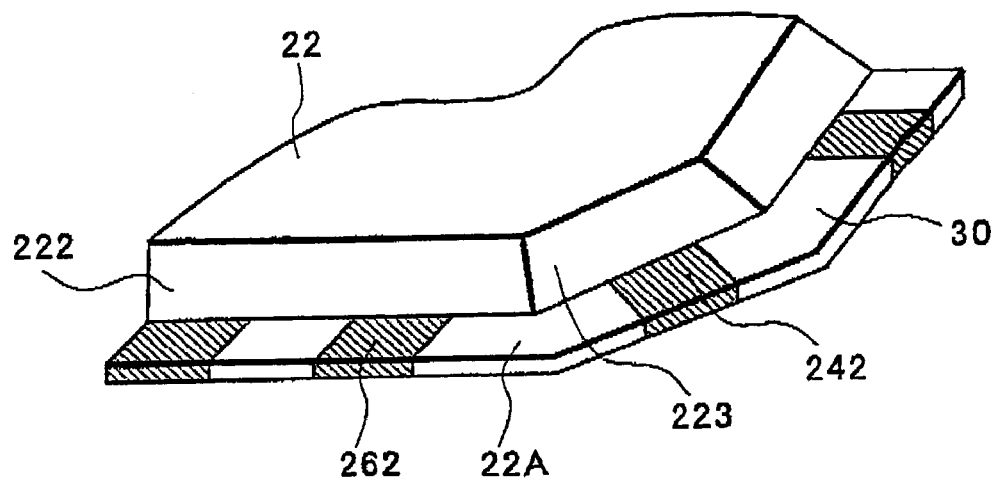
FIG. 3(A) is an explanatory perspective view and FIG. 3(B) is an explanatory perspective view, illustrating a semiconductor device according to the present invention.
Figure 3B:
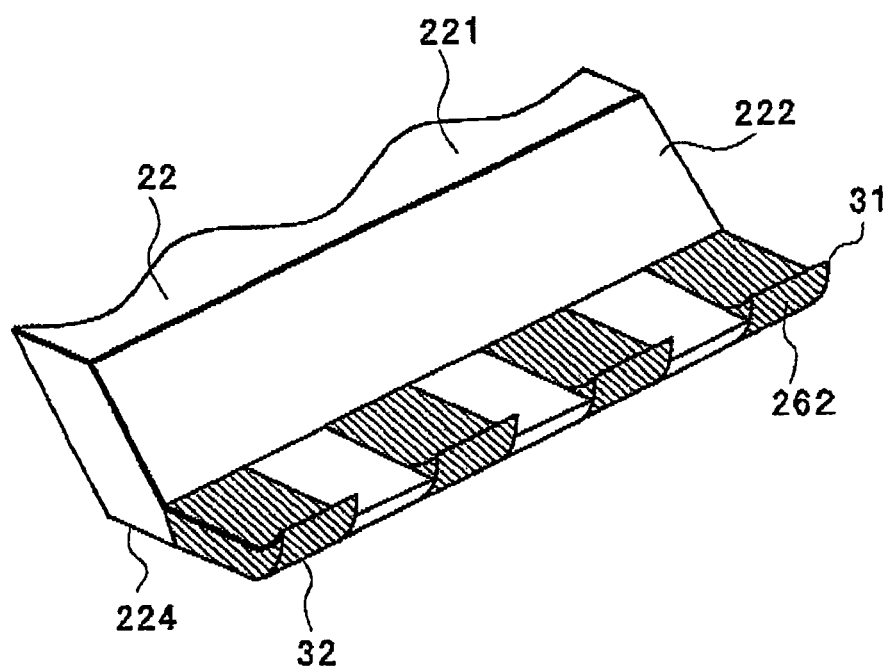

Now, FIG. 3(A) is a perspective view illustrating a portion of a semiconductor device according to some preferred embodiments of the present invention. FIG. 3(B) is an enlarged view illustrating a lead of the semiconductor device according to some preferred embodiments of the present invention. As shown in FIG. 3(A), in practice, plastic is integrally formed between the ends 262 of the leads 26 exposed on the insulating resin 22. The plastic is also formed integrally between the one end 262 of the leads 26 and the other end 242 of the lifting leads 24. This is because only a limited number of the leads 26 and the lifting leads 24 are exposed on the side surfaces 222 and 223 of the insulating resin 22, and plastic 22A between the leads 26 and the lifting leads 24 and the leads 26 is integrated with the insulating resin 22 itself because of the lifting leads 24 and the leads 26 themselves having a thickness of, for example, approximately 100 μm through 250 μm. The semiconductor device preferably includes that an outer peripheral surface 30 defined by the lifting leads 24, the leads 26, and the plastic 22A between the lifting leads 24 and the leads 26 has generally the same plane and the same thickness. Although detailed in a manufacturing method described later, this structure can allow a lead cutting jig to reliably secure the lifting leads 24 and the leads 26 upon cutting the semiconductor device 21 out of the lead frame 41.

Furthermore, as shown in FIG. 3(B), the semiconductor device preferably includes that the one end 262 of the leads 26 has a stamped surface 32 on the reverse surface 224 of the insulating resin 22, thus allowing burrs 31 of the leads 26 to be produced on the front surface 221 of the insulating resin 22. Conversely, the burrs 31 produced on the reverse surface 224 of the insulating resin 22 can be crushed when mounting the semiconductor device 21 onto the mounting substrate, the crushed burrs 31 causing mounting deficiencies. Suppose that the burrs 31 remain uncrushed. In this latter case, the flatness of the reverse surface 224 of the insulating resin 22 would be degraded, thereby reducing the mounting accuracy and the mounting strength. That is, with the aforementioned structure, it is possible to provide, e.g., an improved mounting accuracy and mounting strength to the semiconductor device. As illustrated, the stamped surface 32 has a curved surface. The same holds true for the lifting leads 24, and the lifting leads 24 have a similar structure.

In the foregoing, reference has been made to a QFN semiconductor device. However, the various embodiments of the present invention are not limited thereto. Similar effects can be obtained for other semiconductor devices such as, for example, QFP semiconductor devices. Furthermore, various other modifications can be made without deviating from the spirit and scope of the present invention.

Now, with reference to FIG. 4 through FIG. 11, a method for manufacturing, e.g., the QFN semiconductor device according to some embodiments of the present invention will be described below. To describe the manufacturing method, reference is made to like components, in like figures, designated by the like reference numerals, which have been used for describing the aforementioned semiconductor devices.

Figure 4:
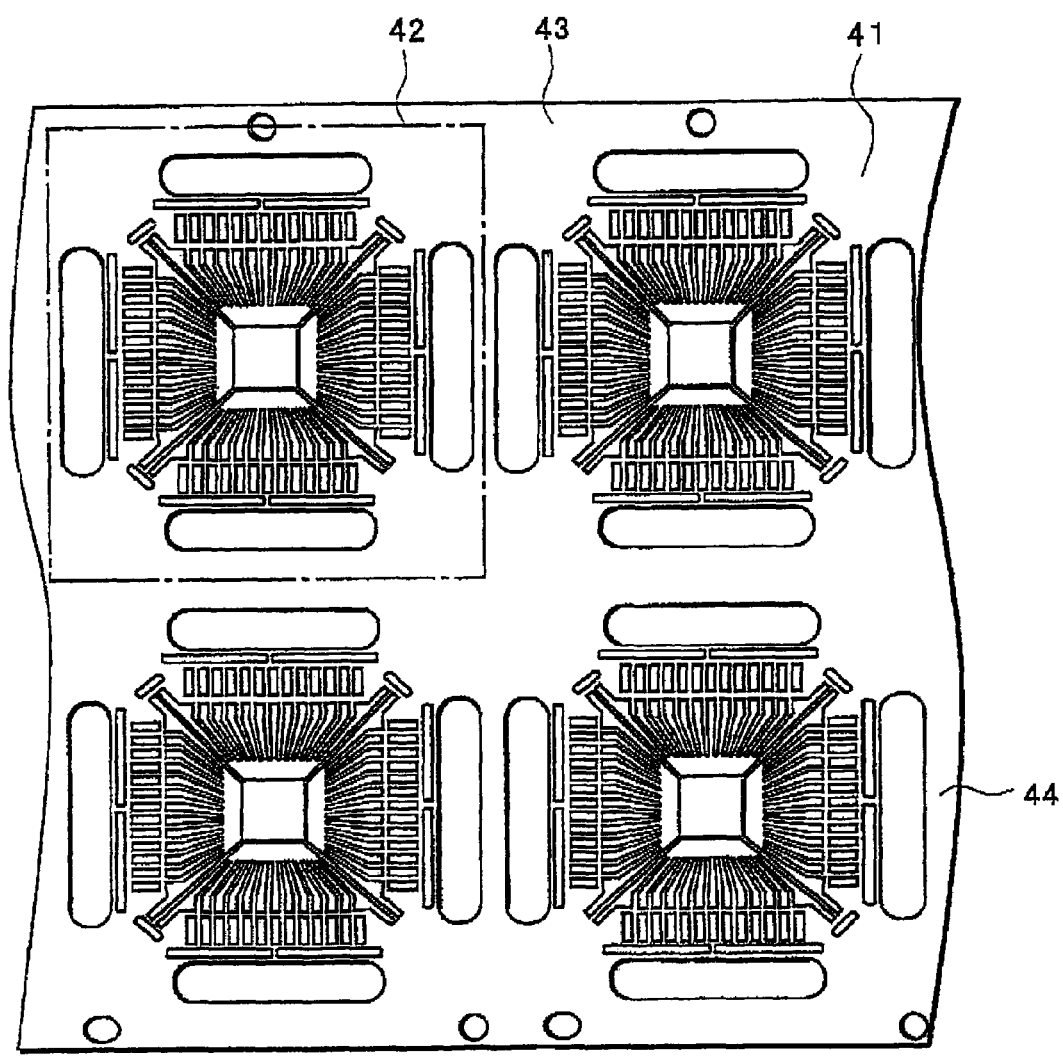
FIG. 4 is an explanatory view illustrating a method for manufacturing a semiconductor device according to the present invention.
Figure 5:
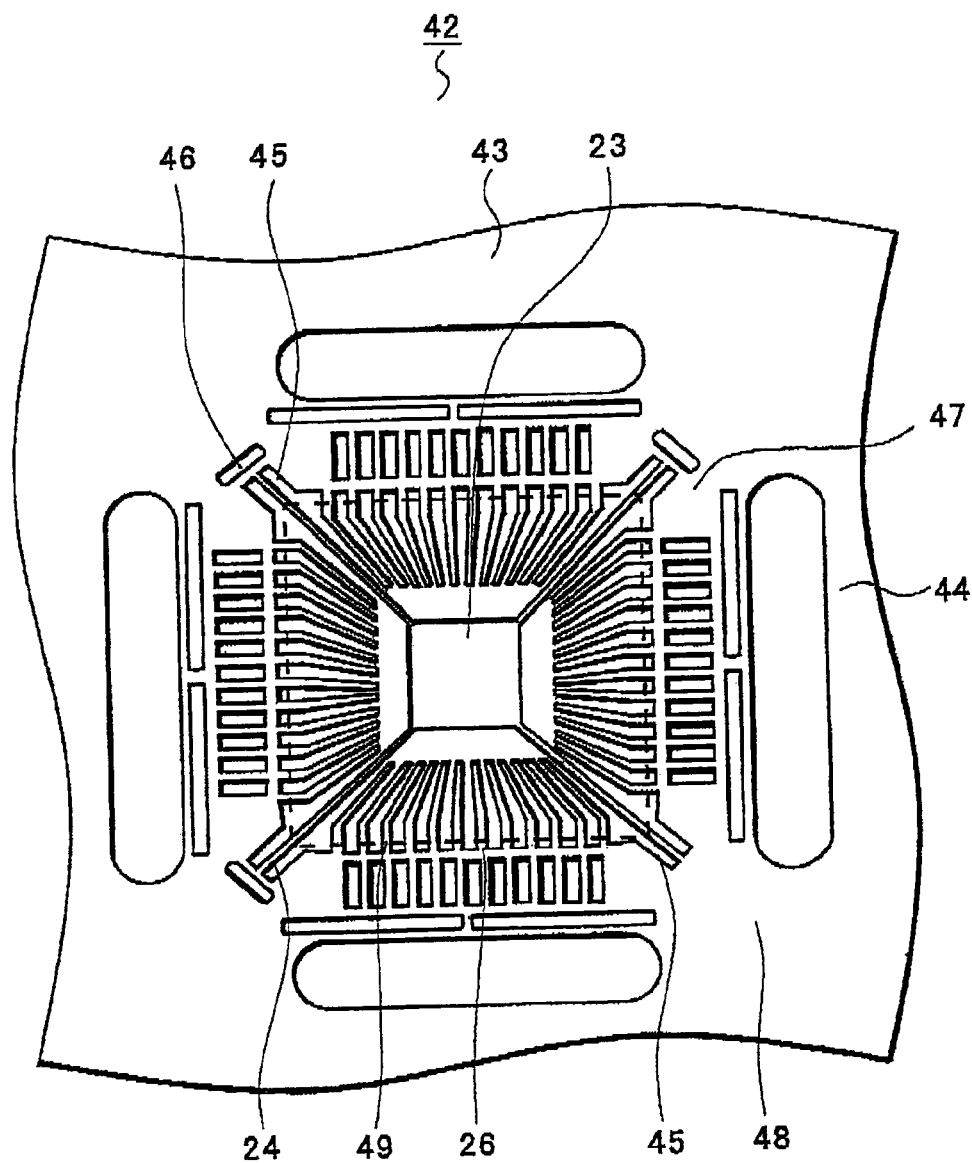
FIG. 5 is an explanatory view illustrating a method for manufacturing a semiconductor device according to the present invention.

As shown in FIG. 4 and FIG. 5, in a first step, a lead frame is preferably prepared.

FIG. 4 is a plan view illustrating a lead frame used for the semiconductor device according to some preferred embodiments of the present invention. As illustrated, the lead frame 41 used in these embodiments is made of a frame, for example, mainly composed of copper and approximately 100 μm through 250 μm in thickness. However, the lead frame may be mainly composed of Fe—Ni or any other metal material. On the lead frame 41, there are formed a plurality of mounting portions 42 indicating a unit corresponding to one semiconductor device shown by an alternate long and short dashed line. In FIG. 4, only four mounting portions 42 are shown. However, at least one mounting portion 42 can be provided in various embodiments. The mounting portion 42 is preferably surrounded with a pair of first coupling strips 43 extending substantially horizontally on the page and a pair of second coupling strips 44 extending substantially vertically on the page. The first and second coupling strips 43 and 44 allow a plurality of mounting portions 42 to be placed on one lead frame 41.

FIG. 5 is an enlarged plan view illustrating one mounting portion of the lead frame shown in FIG. 4. More specifically, as illustrated, the mounting portion 42 preferably includes: the island 23; the lifting leads 24 for supporting the island 23; a plurality of the leads 26 located near the four sides of the island 23, surrounding the four sides, and extending towards the first and second coupling strips 43 and 44; regions 47 located in the direction of extension of the lifting leads 24 and surrounded by the lifting leads 24 and the first and second coupling strips 43 and 44; a first air vent 45 and a second air vent 46 which are provided on the region 47. In these embodiments, the three air vent formed regions 47 are each provided with the first air vent 45 and the second air vent 46. These may be, however, provided in at least one region 47. On the other hand, at least one plastic injection inlet is required. In these embodiments, such is preferably provided at the lower right corner region 48 where the second air vent 46 is not formed. The plastic injection inlet does not necessarily have to be provided on the four corner portions, but the first air vent 45 and the second air vent 46 may be formed on each of all the air vent formed regions 47 at all four corner portions. Additionally, in these embodiments, the two types of holes provided on the lead frame 41 are defined as the first air vent 45 and the second air vent 46, respectively.

Figure 6:
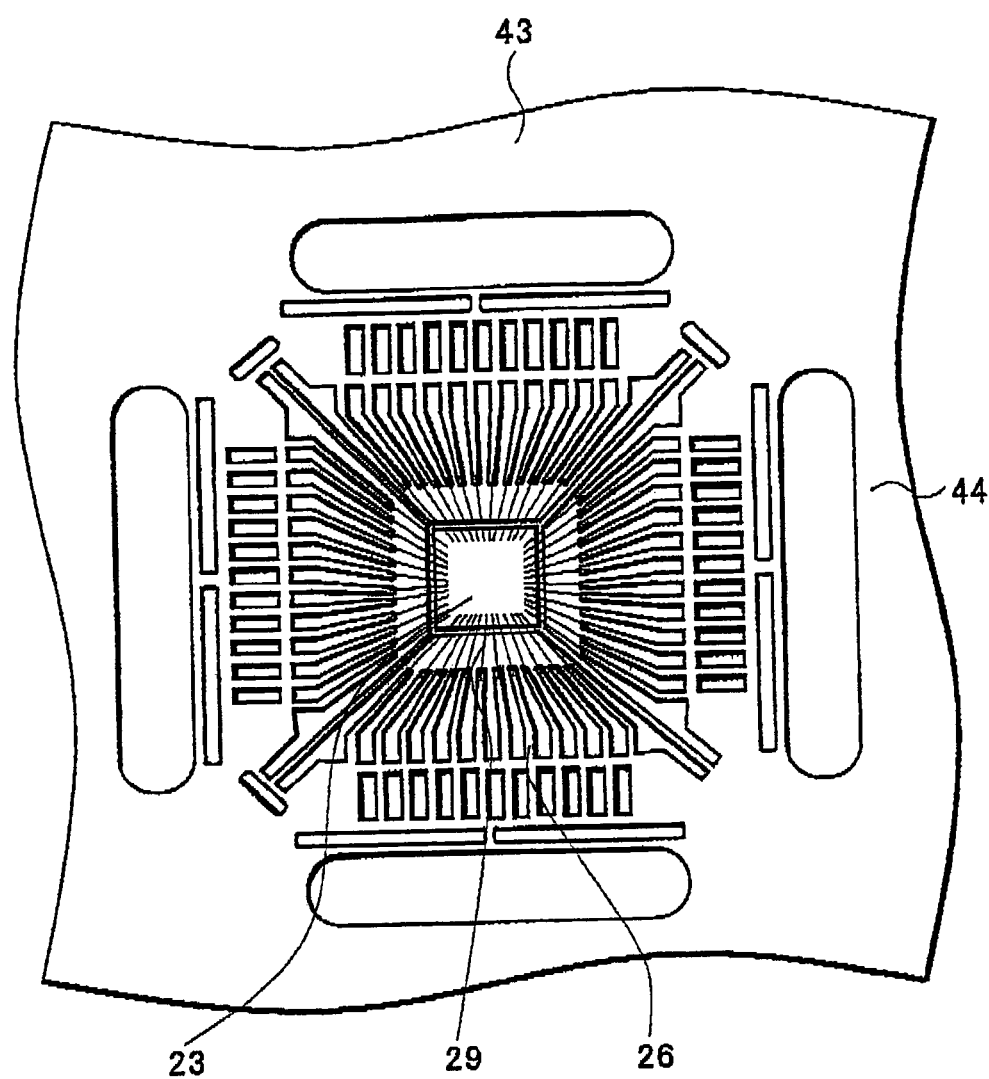
FIG. 6 is an explanatory view illustrating a method for manufacturing a semiconductor device according to the present invention.

As shown in FIG. 6, in a second step, the semiconductor element 28 is preferably die bonded on the island 23 of the lead frame 41. Then, the thin metal wire 29 is preferably wire bonded between the electrode pad portions (not shown) of the semiconductor element 28 and the leads 26 are electrically connected therebetween.

In this step, the semiconductor element 28 is preferably die bonded onto and thereby secured on the surface of the island 23 with the electrically conductive paste 27 such as, for example, Ag paste for each mounting portion 42 of the lead frame 41. Thereafter, the electrode pad portions of the semiconductor element 28 and the leads 26 can be connected to each other with the thin metal wire 29. The aforementioned thin wire can be made of Au, for example. At this time of connection of the thin metal wire 29 using wire bonding, ball bonding is preferably carried out on the electrode pad portions and stitch bonding is preferably carried out on the leads 26. Although not illustrated, the island 23 may be plated with, for example, silver or gold in consideration of adherence to the electrically conductive paste. On the other hand, the leads 26 are, for example, plated with silver or nickel in consideration of adherence to the thin metal wire 29. For the adhering means to be used for the semiconductor element 28, adhering material or film made of, e.g., Au—Si foil, a brazing material such as solder or insulating material, according to usage applications, can be employed.

Figure 7A:
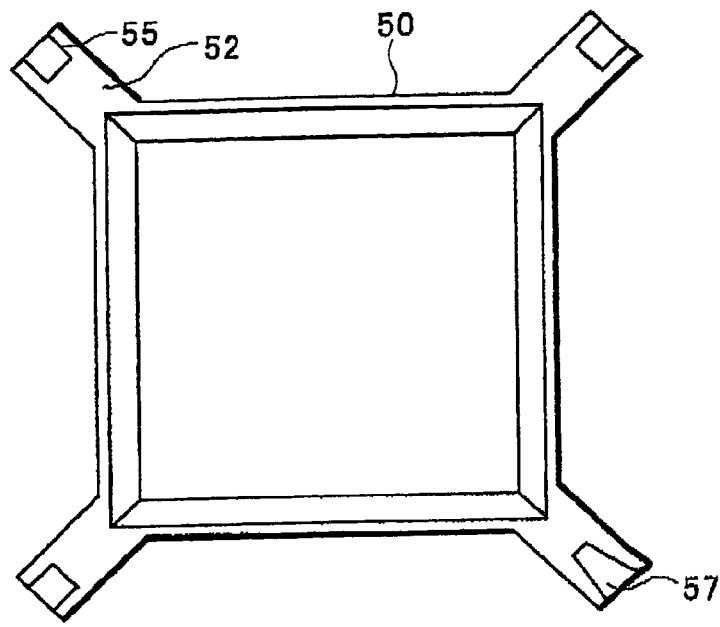
FIG. 7 is an explanatory view illustrating a method for manufacturing a semiconductor device according to the present invention.
Figure 7B:
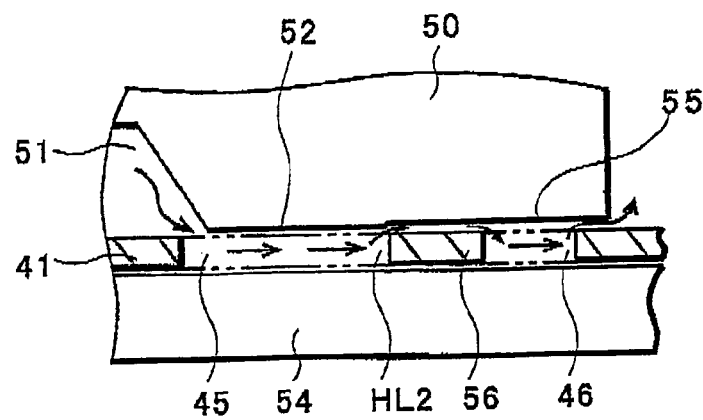
Figure 7C:
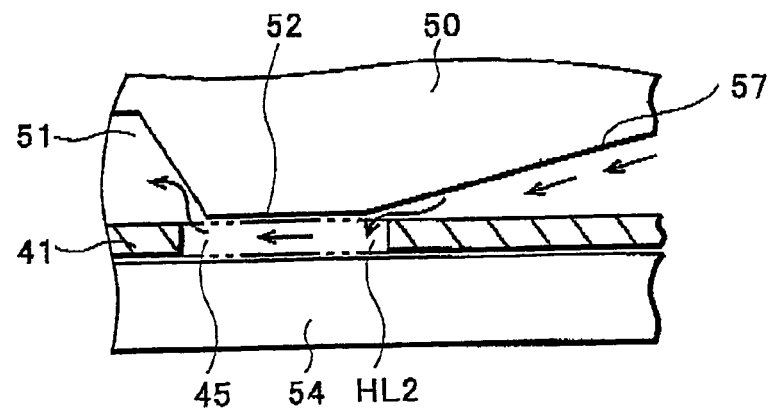
Figure 8:
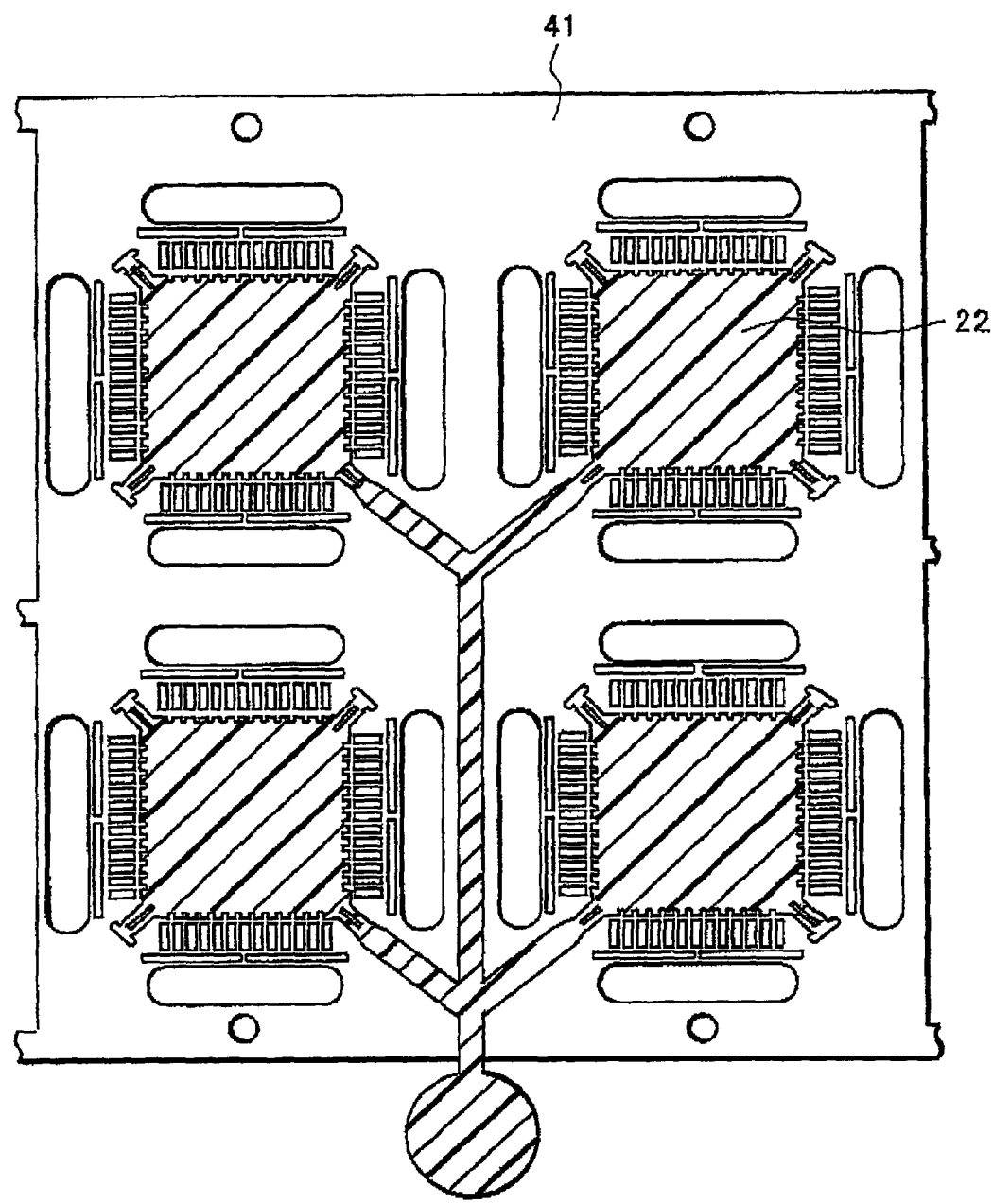
FIG. 8 is an explanatory view illustrating a method for manufacturing a semiconductor device according to the present invention.
Figure 9:
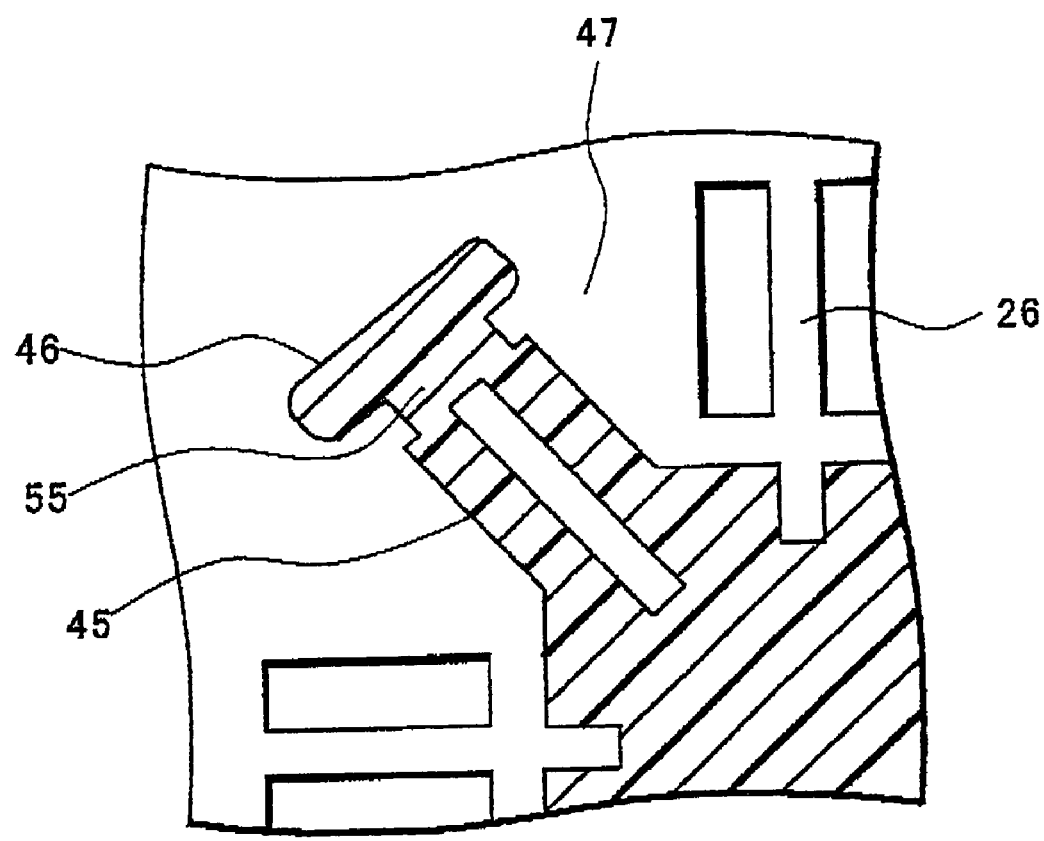
FIG. 9 is an explanatory view illustrating a method for manufacturing a semiconductor device according to the present invention.

As shown in FIG. 7 through FIG. 9, in a third step, the individual mounting portions on the lead frame are molded of plastic using a plastic encapsulation mold.

FIG. 7(A) is a plan view illustrating the inside upper mold according to some embodiments. FIG. 7(B) is a cross-sectional view illustrating a portion of an air vent formed region at the time of plastic molding. FIG. 7(C) is a cross-sectional view illustrating the plastic injection portion at the gate portion.

As shown in FIG. 7(A), there is formed an abutting surface 52 to the air vent formed region 47 shown in FIG. 5 at each of the corner portions of a cavity 51 in an upper mold 50. Preferably, the abutting surface 52 abuts a lower mold 54 to thereby support the lead frame 41 in a cavity 51. The first and second air vents 45 and 46 formed on the lead frame 41 are preferably communicated with each other with an air vent groove 55 provided in the upper mold 50. As shown in FIG. 7(B), the air vent groove 55 is preferably located so as to cover a portion 56 of the lead frame 41 that separates the first air vent 45 from the second air vent 46. More specifically, the air vent groove 55 is preferably configured to be approximately 10 μm through 50 μm in depth from the abutting surface 52. The air vent groove 55 preferably has a length sufficient to communicate between the first air vent 45 and the second air vent 46, slightly overlapping the first and second air vents 45 and 46. Like the upper mold 50, it is also preferable to form an air vent groove for communicating between the first and second air vents 45 and 46 on the lower mold 54.

Referring again to FIG. 7(B), the air flow inside the cavity 51, especially in the corner portions of the cavity 51 having the abutting surface 52 with the first and second air vents 45 and 46 formed thereon, is described below. As illustrated, at the time of plastic molding, the air and plastic that are driven towards the corner portions inside the cavity 51 can flow into the first air vent 45. At this time, since the lead frame 41 is, for example, approximately 100 μm through 250 μm in thickness, the first air vent 45 is, for example, also approximately 100 μm through 250 μm in depth. Accordingly, not only the air inside the cavity 51 but also the plastic can flow into the first air vent 45 all together. Inside the first air vent 45, the air gathers near HL2, flowing into the second air vent 46 via the air vent groove 55 provided on the upper mold 50 or the lower mold 54. Here, the air vent groove 55 is formed to have, for example, approximately 30 μm through 50 μm in width. As described above, since the first air vent 45 is approximately 100 μm through 250 μm in depth, in reference to the first air vent 45 generally no unfilled volumes are formed before the plastic cutting surface that constitutes the outer peripheral surface 30 in most cases.

Figure 15A:
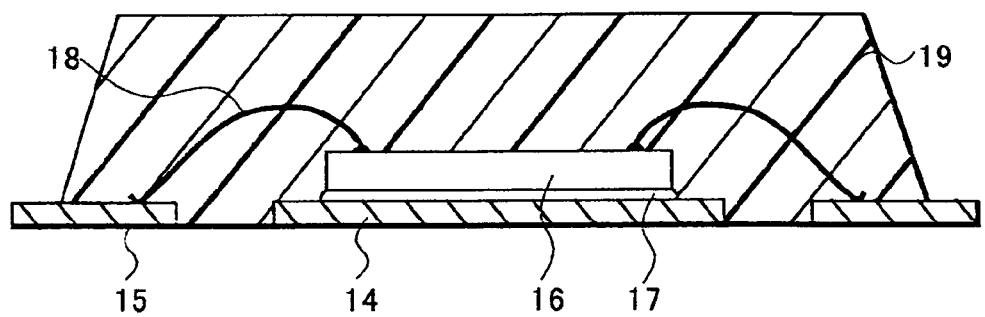
FIG. 15(A) is an explanatory cross-sectional view and FIG. 15(B) is an explanatory cross-sectional view, illustrating a prior art semiconductor device.
Figure 15B:
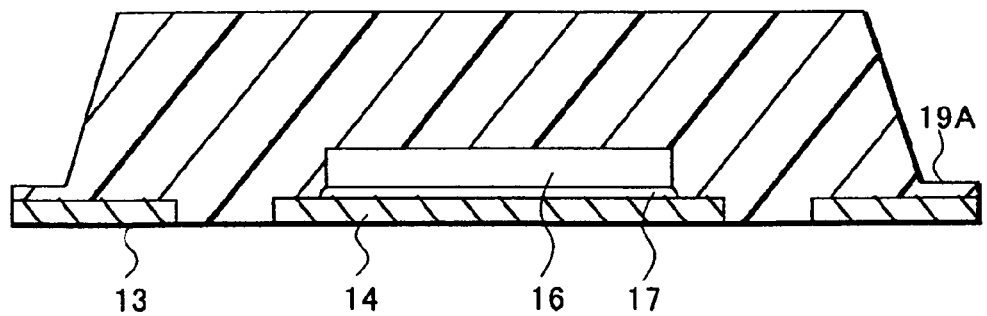

As shown in FIG. 7(C), the manufacturing methods of the preferred embodiments can include that plastic is injected into the cavity 51 using the first air vent 45 even at a gate portion 57. As illustrated, the gate portion 57 provided in the upper mold 50 is not formed to directly follow the cavity 51, but its top portion is located on the HL2 side of the first air vent 45. As shown by the arrows, this causes the plastic flowing from the gate portion 57 to flow into the cavity 51 via the first air vent 45. As at the other corner portions, the abutting surface 52 of the upper mold 50 is preferably located on the upper surface of the first air vent 45 even at the gate portion 57. As a result, on the upper surface of the outer peripheral surface 30 (see, e.g., FIG. 3) formed successively to the side surfaces 222 and 223 of the insulating resin 22, substantially no or no plastic burrs 19A (see FIG. 15(B)) are produced which are otherwise produced in the existing background structures, and the outer peripheral surface 30 can be formed in substantially the same or in the same plane.

That is, according to the preferred manufacturing methods, the cavity 51 can be substantially sealed with the abutting surface 52 of the molds 50 and 54, allowing the plastic to be injected into the cavity 51 and the plastic and air to be exhausted out of the cavity 51 via the first air vent 45. This structure can provide significant improvement over existing background structures that have no air vent and gate portion provided on the mold successively to the cavity. This makes it possible to form the outer peripheral surface 30 formed successively to the aforementioned insulating resin 22 generally in the same flat surface having substantially no or no recessed or projected portions due to the plastic. As described above, configuring the gate portion 57 in a like manner makes it possible to form the entirety of the outer peripheral surface 30 of the side surface of the insulating resin 22 generally in the same flat surface.

As shown in FIG. 8 and FIG. 9, using the aforementioned plastic encapsulation molds 50 and 54 allows the insulating resin 22 to be formed to cover the lead frame 41 for each mounting portion 42. FIG. 8 is a plan view illustrating the insulating resin 22 formed on the lead frame 41. FIG. 9 is a plan view illustrating the insulating resin 22 formed on the first and second air vents 45 and 46 of the mounting portion 42 shown in FIG. 8. Using the plastic encapsulation molds 50 and 54 shown in FIGS. 7(A)–7(C) can cause the plastic flowing from the cavity 51 to be hardened at the first air vent 45, the air vent groove 55, and at least part of the second air vent 46. Accordingly, upon removing the package from the molds, the package is removed integrally with the lead frame 41 and the insulating resin 22. The air inside the cavity 51 can escape outside from the second air vent 46 via the air vent groove 55 as shown by the arrows in FIG. 7(B). The manufacturing method according to the preferred embodiments makes it possible to, e.g., remove the air in the cavity 51 out of the portion of the originally insulating resin 22 formed region as shown by the dashed line in FIG. 5. As a result, an air passage having a thickness of substantially that of the lead frame 41 can be reliably provided in the first air vent 45, forming substantially no unfilled region at the end portion of the insulating resin 22. Although not illustrated, to form the recessed portion 25 on the reverse surface 224 of the insulating resin 22, a projected portion corresponding to the recessed portion 25 can be formed on the side of the cavity 51 in the lower mold 54.

In a fourth step, the lead frame 41 exposed on the insulating resin 22 is preferably plated.

In this step, to inhibit leads from being oxidized and for solder wettability, the lead frame 41 can be plated. At this time, the entire lead frame 41 having a plurality of mounting portions 42 formed thereon is preferably plated. For example, a plurality of lead frames 41 can be plated at a time with the lead frames 41 or a plating assist rack for accommodating the lead frames 41 being connected to the cathode electrode and with plating baths being connected to the anode electrode. At this time, prepared in the plating baths are plating solutions such as, for example, Pd, Sn, Ni, Sn—Pb, Sn—Bi, Sn—Ag, Sn—Cu, Au—Ag, and/or Sn—Ag—Cu. In addition, at least one layer of plating film can be formed on the lead frame 41 in combination of these plating solutions. To plate the lead frame 41 with a Pd solution, for example, a lead frame 41 that is pre-plated with Pd before plastic molding can be used.

Figure 10:
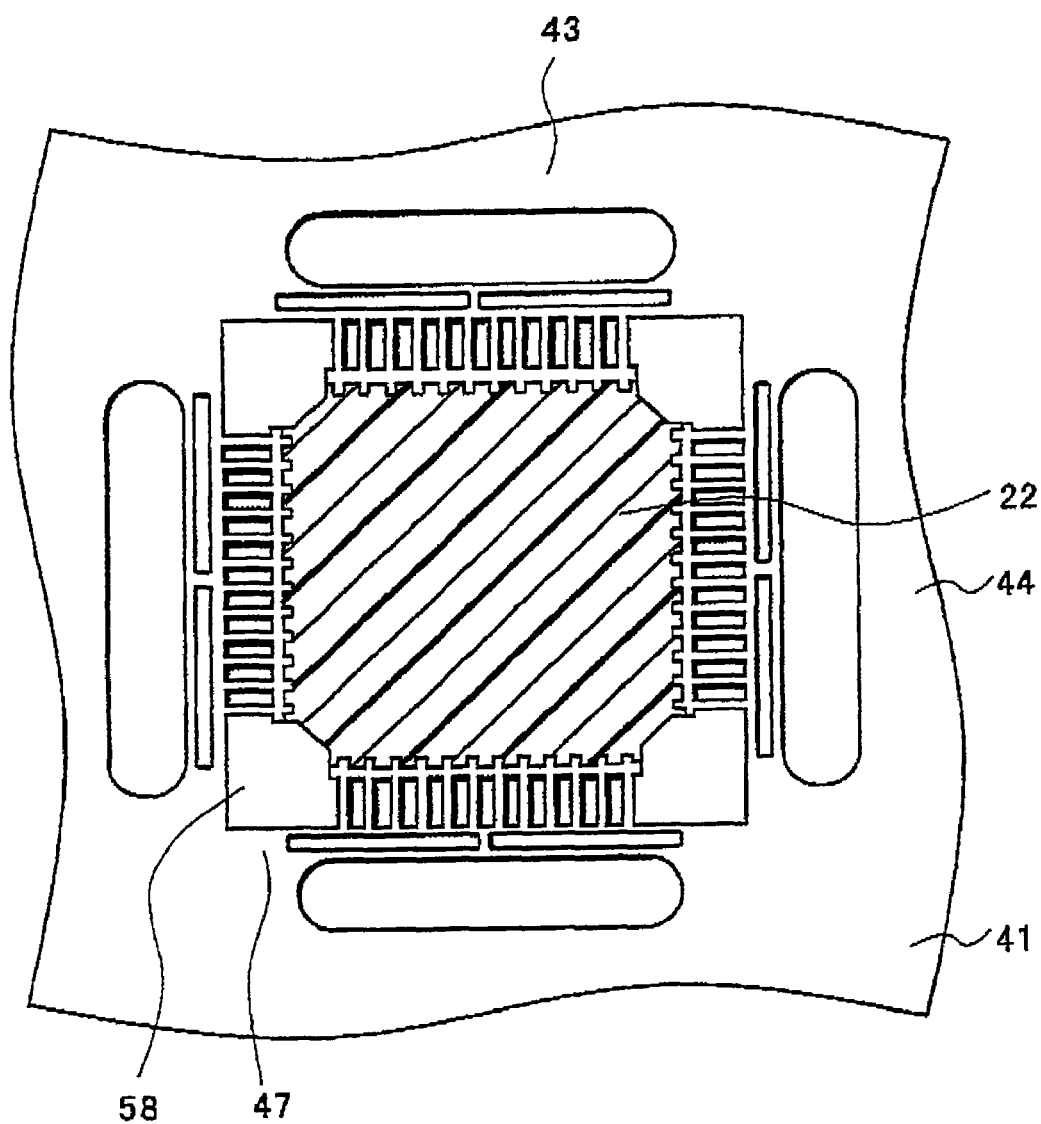
FIG. 10 is an explanatory view illustrating a method for manufacturing a semiconductor device according to the present invention.

As shown in FIG. 10 and FIG. 11, in a fifth step, a plurality of semiconductor devices 21 formed on the lead frame 41 are preferably cut out of the lead frame 41.

Figure 11A:
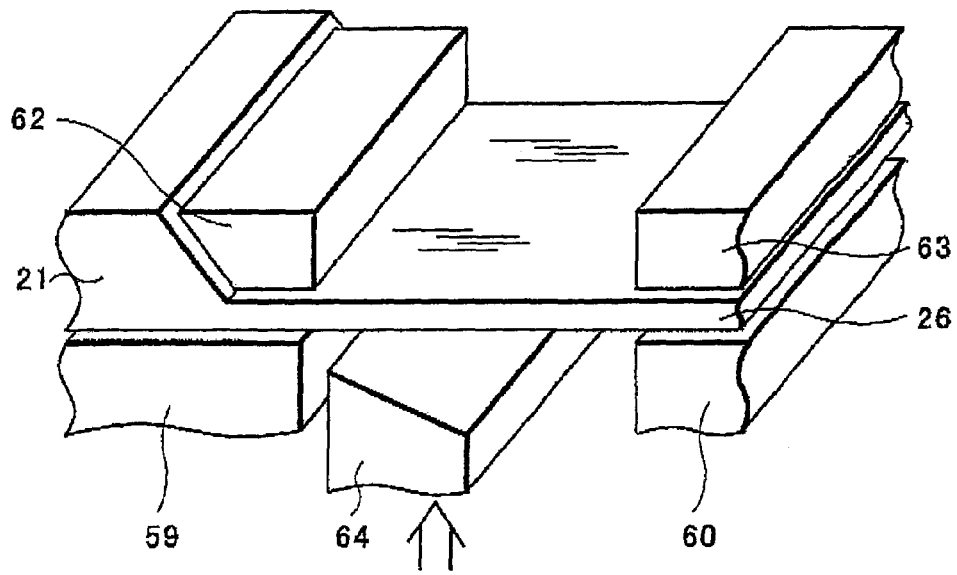
FIG. 11 is an explanatory view illustrating a method for manufacturing a semiconductor device according to the present invention.
Figure 11B:
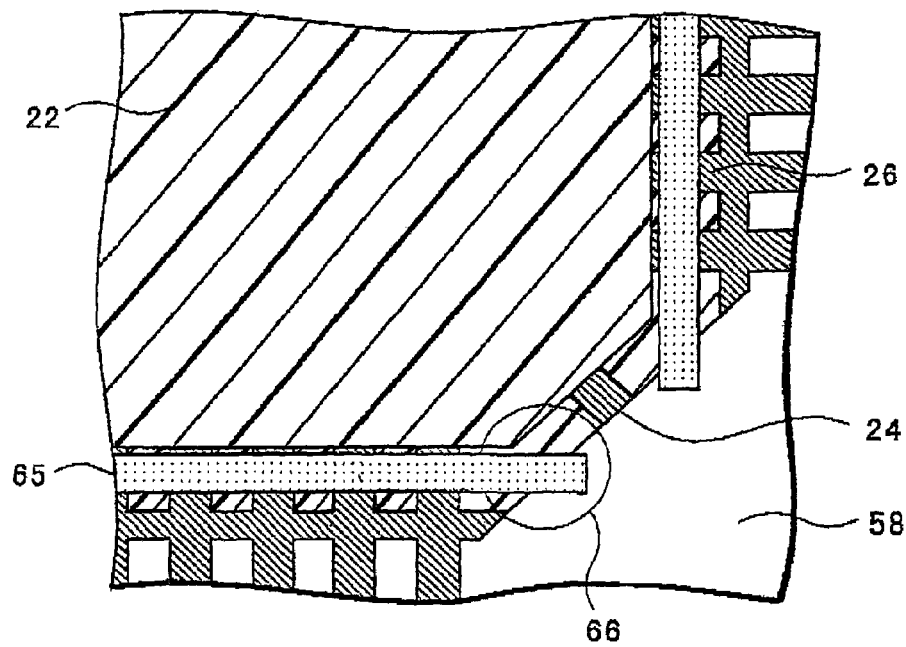
Figure 12:
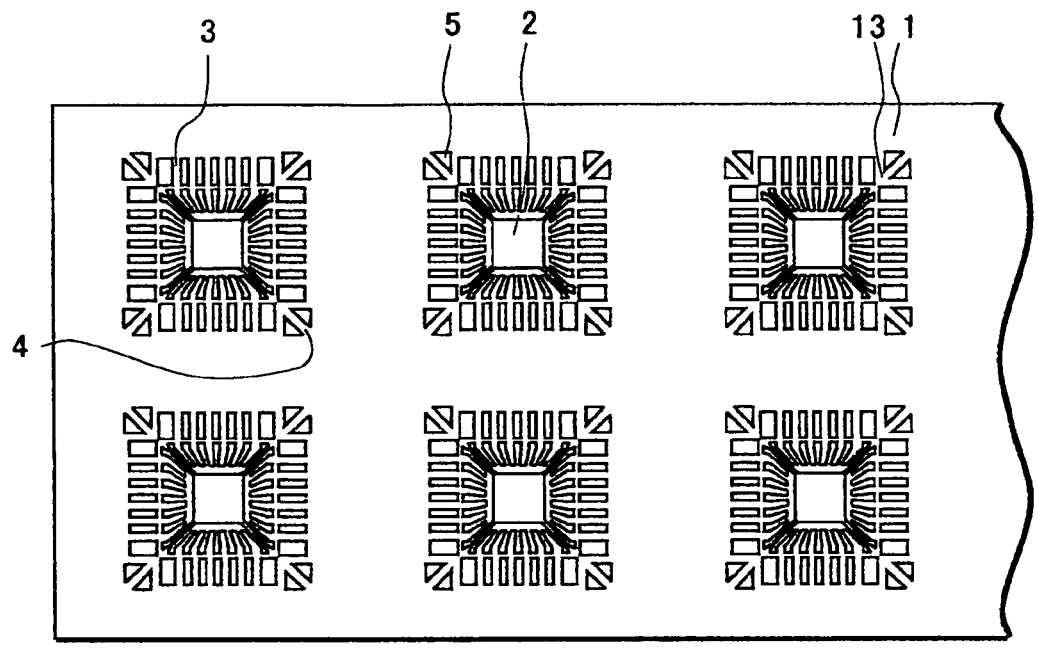
FIG. 12 is an explanatory view illustrating a method for manufacturing a prior art semiconductor device.
Figure 13:
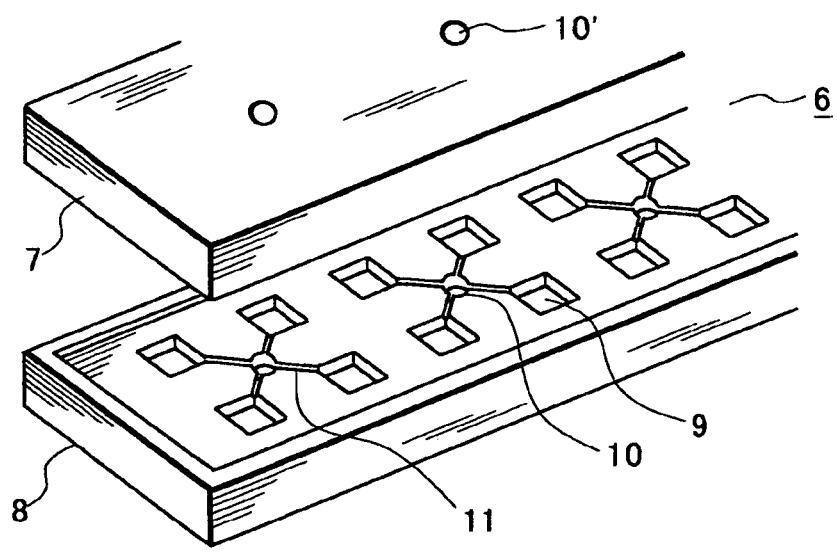
FIG. 13 is an explanatory view illustrating a method for manufacturing a prior art semiconductor device.
Figure 14:
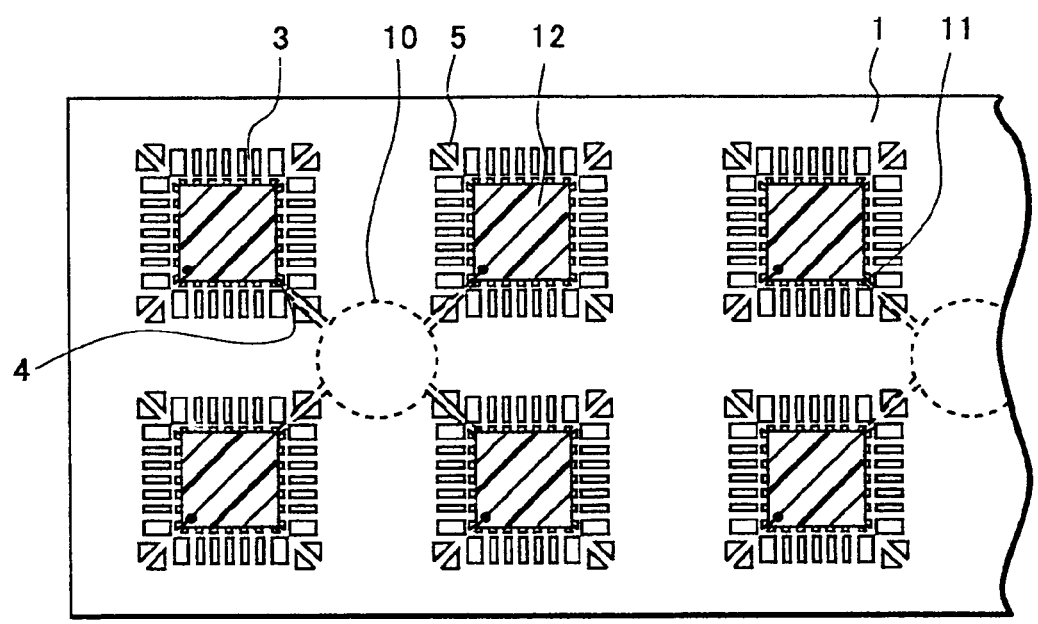
FIG. 14 is an explanatory view illustrating a method for manufacturing a prior art semiconductor device.

FIG. 10 is a plan view illustrating a lead frame from which the first and second air vent formed regions have been cut away. FIG. 11(A) is a perspective view illustrating a lead frame from which the lifting leads 24 or the leads 26 are being cut away. FIG. 11(B) is a plan view illustrating the securing region at the time of cutting the leads 26 according to some preferred embodiments. As described above, first, as shown in FIG. 9, a method for manufacturing a semiconductor device according to some preferred embodiments allows the plastic flowing out of the cavity 51 to be hardened in the first air vent 45. This causes substantially no or no plastic burrs to be produced near the insulating resin 22 on the outer peripheral surface 30 including the lead frame 41.

Since the lead frame 41 has a thickness, for example, of approximately 100 μm through 250 μm, the plastic flowing out of the cavity 51 can be hardened integrally inside the first air vent 45, the air vent groove 55, and the second air vent 46. That is, the plastic inside the first and second air vents 45 and 46 can be extremely hardened due to the thickness of the lead frame 41 to cause the plastic inside the air vent groove 55 to be integrated together. This allows the plastic flowing out of the cavity 51 to be hardened at a predetermined position. As a result, upon stamping the first and second air vents 45 and 46, it is possible to remove substantially all or all of the plastic burrs from the lead frame 56 between the first and second air vents 45 and 46. In the step of cutting the portion of the lifting leads 24, the lifting leads 24 and the plastic can be cut with the outer peripheral surface 30 successive to the insulating resin 22 being reliably secured. That is, as shown in FIG. 3(A), since substantially no or no projected and recessed portions are formed due to the plastic on the outer peripheral surface 30, the lifting leads 24 and the plastic 22A can be reliably secured with support means 62 (see, e.g., FIG. 11) and cut. As illustrated, the lifting leads 24 and the plastic 22A can be cut at the immediate end of the leads 26 on each side with the outer peripheral surface 30 remaining uncut. With the lead frame 41 partially remaining and coupled to the first and second coupling strips 43 and 44, the mounting portions 42 are not separated from the lead frame 41.

Now, as shown in FIGS. 11(A)–11(B), since the semiconductor device 21 according to some preferred embodiments is a QFN semiconductor device, the leads 26 are preferably cut near the boundary at which the leads 26 are exposed on the insulating resin 22. In this step, the individual semiconductor devices 21 are preferably cut away from the lead frame 41 at the same time. As shown in FIG. 11(A), the semiconductor device 21 having been subjected to plating can be placed on seats 59 and 60. Then, the exposed boundary portion of the leads 26 in the semiconductor device 21 can be secured with the support means 62, while the tip end portion of the leads 26 can be secured with support means 63. The leads 26 can be cut with a punch 64 to separate the semiconductor device 21 from the lead frame 41.

The method for manufacturing the semiconductor device according to the preferred embodiments includes that upon cutting the leads 26, the punch 64 is stamped from the mounting surface of the semiconductor device 21 to cut the leads 26 and their peripheral plastic 22A (e.g., FIGS. 3(A)–3(B)). As shown in FIG. 3(B), by this manufacturing method, a stamped surface 32 of the leads 26 can be formed on the side of the mounting surface of the semiconductor device 21. On the other hand, burrs 31 of the leads 26 can be produced on the surface opposite to the mounting surface of the semiconductor device 21. Some effects provided by this structure have been described above and are omitted here. Similar effects can also be obtained upon cutting the lifting leads 24 since the lifting leads 24 are also cut from the mounting surface. That is, the semiconductor device can include a stamped surface 32 formed on the mounting surface.

Furthermore, the method for manufacturing the semiconductor device according to the preferred embodiments includes that upon cutting the lifting leads 24 and the leads 26, they are cut with the punch 64 with the leads 26 being reliably secured with the support means 62. As shown in FIG. 11(B), for example, a securing region 65 of approximately 50 μm through 200 μm, which is located near the insulating resin 22 after having been cut and shown by the shaded portion, can be secured with the support means 62. As can be seen from the figure, the periphery of the exposed region of the lifting leads 24 can also be secured. At this time, as described in the third step of forming the insulating resin 22, substantially no or no projected or recessed portions are formed on the outer peripheral surface 30 successive to the side surfaces 222 and 223 of the insulating resin 22. In particular, as described above, even in the air vent formed regions 47 (see, e.g., FIG. 5) substantially no or no plastic burrs are produced on the outer peripheral surface 30 successive to the side surfaces 223 of the insulating resin 22. Additionally, substantially no or no plastic burrs are produced on the outer peripheral surface 30 even in the gate portion 57 (see e.g., FIGS. 7(A)–7(C)) for injecting plastic therethrough. Accordingly, in preferred embodiments, the plastic burrs 19A (see, e.g., FIG. 15(B)), which would be otherwise produced in the background art, are substantially never or never formed in the region shown by a circle 66. Thus, the securing region 65 located in the outer peripheral surface 30 would have substantially no or no projected or recessed portions present thereon due to plastic burrs and would have generally the same flat surface. As described above, with the leads 26 being reliably secured by the support means 62, the leads 26 and their peripheral plastic 22A can be cut. As a result, the cutting surface of plastic 22A between the leads 26 and between the lifting leads 24 and the leads 26 can be prevented from generating microcracks. They can thus be formed in a stable and substantially constant shape. Furthermore, substantially no or no microcracks grow to be crushed in the subsequent steps of testing the properties of the semiconductor device, lapping, and mounting. In particular, in the mounting step, it is possible to realize a semiconductor device that will substantially never or never induce mounting deficiencies due to plastic particles or the like. It is also possible to improve the life cycle of the punch 64. Thereafter, the semiconductor device 21 shown in FIG. 1 can be completed.

Thus, summarizing the aforementioned steps of some preferred embodiments, in a method for manufacturing a semiconductor device according to some preferred embodiments, a lead is used having a first air vent 45 formed thereon across the side surfaces 223 on which the lifting leads 24 are exposed from the insulating resin 22. At the first air vent 45 formed region, the abutting surfaces 52 of the molds 50 and 54 can sandwich the lifting leads 24. This abutting surface 52 allows plastic to be injected into the cavity 51 and the air and plastic to be substantially exhausted from the cavity 51 only through the first air vent 45. This allows the outer peripheral surface 30 formed successively to the side surfaces 222 and 223 of the insulating resin 22 to have generally the same plane, and substantially no or no projected or recessed portions are produced on the surface due to plastic burrs on the surface thereof. With this structure, upon cutting the lifting leads 24 and the leads 26 away from the lead frame 41, the outer peripheral surface 30 successive to the side surfaces 222, 223 of the insulating resin 22 can be reliably secured with the support means 62 of a cutting jig and cut. As a result, it is possible to minimize microcracks in the plastic 22A of the outer peripheral surface 30 upon cutting, thereby minimizing mounting deficiencies of a semiconductor device 21.

In some embodiments, a method for manufacturing the semiconductor device has been described in which two air vents are formed. However, the present invention is not limited thereto. For example, similar effects can be obtained with at least a first air vent formed successively to the cavity. A pre-plated lead frame can also be used to obtain similar effects. Furthermore, other various modifications can be made without deviating from the spirit and scope of the present invention.

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited.

What is claimed is:

1. A semiconductor device, comprising
   at least one island,
   a semiconductor element fixedly attached to a surface of said island,
   a plurality of leads extending from a vicinity of said island outwardly and lifting leads extending outwardly from corner portions of said island,
   an insulating resin for covering said island, said semiconductor element, said plurality of leads, and said lifting leads integrally,
   plastic hardened between said plurality of leads exposed on said insulating resin, plastic hardened between said plurality of leads exposed on said insulating resin and said lifting leads, wherein
   an outer peripheral surface defined by surfaces of said plurality of leads, said lifting leads, and said hardened plastics is formed to a side surface of said insulating resin, and said outer peripheral surface has generally the same flat surface surrounding said insulating resin.

2. The semiconductor device according to claim 1, wherein
   one end of said plurality of leads and one end of said lifting leads have a stamped surface on a side of a reverse surface of said insulating resin.

3. The semiconductor device according to claim 1, wherein
   a reverse surface of said island is located on a surface of said insulating resin, at least part of said reverse surface of said island is exposed on said surface of said insulating resin, and said reverse surface of said island and said surface of said insulating resin form generally the same plane.

4. The semiconductor device according to claim 1, wherein
   a reverse surface of one end of said lifting leads is exposed on a corner portion generally flush with a reverse surface of said insulating resin.

5. The semiconductor device according to claim 1, wherein
   a reverse surface of said insulating resin has a recessed portion at least at part of a region surrounded by an exposed surface of said plurality of leads.

6. The semiconductor device according to claim 5, wherein
   a distance between an exposed surface of said lifting leads and said recessed portion is larger than a distance between said exposed surface of said plurality of leads and said recessed portion.

* * * * *